(12) United States Patent
Wojtczak et al.

(10) Patent No.: US 6,896,826 B2
(45) Date of Patent: May 24, 2005

(54) AQUEOUS CLEANING COMPOSITION CONTAINING COPPER-SPECIFIC CORROSION INHIBITOR FOR CLEANING INORGANIC RESIDUES ON SEMICONDUCTOR SUBSTRATE

(75) Inventors: William A. Wojtczak, Austin, TX (US); Ma. Fatima Seijo, Hayward, CA (US); David Bernhard, Newtown, CT (US); Long Nguyen, San Jose, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 186 days.

(21) Appl. No.: 10/047,554

(22) Filed: Oct. 23, 2001

(65) Prior Publication Data

US 2003/0078173 A1 Apr. 24, 2003

Related U.S. Application Data

(63) Continuation-in-part of application No. 09/818,073, filed on Mar. 27, 2001, now Pat. No. 6,755,989, which is a continuation-in-part of application No. 08/924,021, filed on Aug. 29, 1997, now Pat. No. 6,224,785.
(60) Provisional application No. 60/044,824, filed on Apr. 25, 1997, and provisional application No. 60/034,194, filed on Jan. 9, 1997.

(51) Int. Cl.$^7$ .................. C09K 13/00; C09K 13/04; C09K 13/08; C09K 13/06; H01L 21/302
(52) U.S. Cl. .................. 252/79.1; 252/79.2; 252/79.3; 252/79.4; 438/706; 438/745; 134/1.2; 134/1.3
(58) Field of Search .............. 252/79.1, 79.2, 252/79.3, 79.4; 438/706, 745, 692; 134/1.2, 1.3; 510/176

(56) References Cited

U.S. PATENT DOCUMENTS

| | | | |
|---|---|---|---|
| 4,087,367 A | 5/1978 | Rioult et al. | 252/79.1 |
| 4,371,443 A * | 2/1983 | Keeney | 507/251 |
| 4,569,722 A | 2/1986 | Maury et al. | 216/99 |
| 4,765,844 A | 8/1988 | Merrem et al. | 510/176 |
| 4,795,582 A | 1/1989 | Ohmi et al. | 252/79.3 |
| 4,871,422 A | 10/1989 | Scardera et al. | 216/99 |
| 4,921,572 A | 5/1990 | Roche | 216/99 |
| 5,091,103 A | 2/1992 | Dean et al. | 510/175 |
| 5,241,118 A | 8/1993 | Saxton et al. | 564/55 |
| 5,277,835 A | 1/1994 | Ohmi et al. | 252/79.3 |
| 5,308,745 A | 5/1994 | Schwartzkopf | 430/329 |
| 5,320,709 A | 6/1994 | Bowden et al. | 438/745 |
| 5,334,332 A | 8/1994 | Lee | 510/175 |
| 5,421,906 A * | 6/1995 | Borah | 134/26 |
| 5,466,389 A | 11/1995 | Ilardi et al. | 510/175 |
| 5,571,447 A | 11/1996 | Ward et al. | 510/706 |
| 5,662,769 A | 9/1997 | Schonauer et al. | 438/633 |
| 5,709,756 A | 1/1998 | Ward et al. | 134/1.3 |
| 5,780,406 A | 7/1998 | Honda et al. | 510/175 |
| 5,885,362 A | 3/1999 | Morinaga et al. | 134/2 |
| 5,962,385 A | 10/1999 | Maruyama et al. | 510/176 |
| 5,989,353 A | 11/1999 | Skee et al. | 134/36 |
| 6,030,932 A | 2/2000 | Leon et al. | 510/175 |
| 6,235,693 B1 | 5/2001 | Cheng et al. | 510/175 |

FOREIGN PATENT DOCUMENTS

WO 98/00244 1/1998

* cited by examiner

*Primary Examiner*—Anita Alanko
*Assistant Examiner*—Lynette T. Umez-Eronini
(74) *Attorney, Agent, or Firm*—Margaret Chappuis; Marianne Fuierer; Tristan Ann Fuierer

(57) ABSTRACT

A semiconductor wafer cleaning formulation, including 1–35% wt. fluoride source, 20–60% wt. organic amine(s), 0.1–40% wt. nitrogenous component, e.g., a nitrogen-containing carboxylic acid or an imine, 20–50% wt. water, and 0–21% wt. metal chelating agent(s). The formulations are useful to remove residue from wafers following a resist plasma ashing step, such as inorganic residue from semiconductor wafers containing delicate copper interconnecting structures.

49 Claims, 6 Drawing Sheets

US 6,896,826 B2

AQUEOUS CLEANING COMPOSITION CONTAINING COPPER-SPECIFIC CORROSION INHIBITOR FOR CLEANING INORGANIC RESIDUES ON SEMICONDUCTOR SUBSTRATE

RELATED APPLICATIONS

This application is a continuation-in-part of U.S. patent application Ser. No. 09/818,073 filed Mar. 27, 2001 now U.S. Pat. No. 6,755,989 which in turn is a continuation in part of U.S. patent application Ser. No. 08/924,021 filed on Aug. 29, 1997, now U.S. Pat. No. 6,224,785 which in turn claims priority of U.S. Provisional Patent Application No. 60,044,824 filed Apr. 25, 1997 and U.S. Provisional Patent Application 60/034,194 filed Jan. 9, 1997. Additionally, this application claims priority to and repeats a substantial portion of prior U.S. patent application Ser. No. 09/818,073 filed Mar. 27, 2001 now U.S. Pat. No. 6,755,989 and U.S. patent application Ser. No. 08/924,021 filed on Aug. 29, 1997 now U.S. Pat. No. 6,224,785. Since this application names AN inventor named in the prior application, the application constitutes a continuation in part of the prior application. This application incorporates by reference prior U.S. patent application Ser. No. 09/818,073 filed Provisional Mar. 27, 2001 now U.S. Pat. No. 6,755,989, U.S. patent application Ser. No. 08/924,021 filed on Aug. 29, 1997 now U.S. Pat. No. 6,244,785, U.S. patent application Ser. No. 60/044,824 filed ON Apr. 25, 1997 and U.S. Provisional Patent Application No. 60/034,194 filed ON Jan. 9, 1997.

FIELD OF THE INVENTION

The present invention relates generally to chemical formulations useful in semiconductor manufacturing and particularly to chemical formulations that are utilized to remove residue from wafers following a resist plasma ashing step. More specifically, the present invention relates to cleaning formulations for removal of inorganic residue from semiconductor wafers containing delicate copper interconnecting structures.

DESCRIPTION OF THE PRIOR ART

The prior art teaches the utilization of various chemical formulations to remove residues and clean wafers following a resist ashing step. Some of these prior art chemical formulations include alkaline compositions containing amines and/or tetraalkyl ammonium hydroxides, water and/or other solvents, and chelating agents. Still other formulations are based on acidic to neutral solutions containing ammonium fluoride.

The various prior art formulations have drawbacks that include unwanted removal of metal or insulator layers and the corrosion of desirable metal layers, particularly copper or copper alloys features. Some prior art formulations employ corrosion inhibiting additives to prevent undesirable copper metal corrosion during the cleaning process. However, conventional corrosion-inhibiting additives typically have detrimental effects on the cleaning process because such additives interact with the residue and inhibit dissolution of such residue into the cleaning fluid. Moreover, conventional additives do not easily rinse off the copper surface after completion of the cleaning process. Such additives therefore remain on the surface sought to be cleaned, and result in contamination of the integrated circuits. Contamination of the integrated circuit can adversely increase the electrical resistance of contaminated areas and cause unpredictable conducting failure within the circuit.

The formulation of post CMP cleaners for advanced integrated circuit manufacturing such as copper and tungsten interconnect materials, includes slurry removal and residue dissolution components that accelerate the physical cleaning process. However, these conventional additives typically have detrimental effects on the metal surface by increasing resistance and corrosion sensitivity.

It is therefore one object of the present invention to provide chemical formulations that effectively remove residue following a resist ashing step, and which do not attack and potentially degrade delicate structures intended to remain on the wafer.

It is another object of the present invention to replace conventional additives with an improved corrosion inhibitor for protection of copper structures on the semiconductor substrate.

It is another object of the invention to provide an improved corrosion inhibitor, which is easily rinsed off the substrate by water or other rinse medium after the completion of the residue-removal process, thereby reducing contamination of the integrated circuit.

Other objects and advantages of the invention will become fully apparent from the ensuing disclosure and appended claims.

SUMMARY OF THE INVENTION

The present invention relates generally to chemical formulations useful in semiconductor manufacturing for removing residue from wafers following a resist plasma ashing step.

In one aspect, the invention relates to a method of removing residue from a wafer following a resist plasma ashing step on such wafer, comprising contacting the wafer with a cleaning formulation, including (i) a fluoride source, (ii) at least one organic amine, (iii) a nitrogen-containing carboxylic acid or an imine, (iv) water, and optionally at least one metal chelating agent.

Another aspect of the invention relates to a wafer cleaning formulation, including (i) a fluoride source, (ii) at least one organic amine, (iii) a nitrogen-containing carboxylic acid or an imine, (iv) water, and optionally at least one metal chelating agent.

In a further aspect, the invention relates to a semiconductor wafer cleaning formulation for use in post plasma ashing semiconductor fabrication, comprising the following components in the percentage by weight (based on the total weight of the formulation) ranges shown:

| | |
|---|---|
| a fluoride source, e.g., ammonium fluoride and/or derivative(s) thereof | 1–35% |
| organic amine(s) | 20–60% |
| a nitrogenous component selected from nitrogen-containing carboxylic acids and imines | 0.1–40% |
| water | 20–50% |
| metal chelating agent(s) | 0–21% |
| TOTAL | 100% |

In a still further aspect, the invention relates to a formulation useful for post chemical mechanical polishing (CMP) cleaning, which is a dilute version of the wafer cleaning formulation outlined hereinabove, wherein the dilute formulation comprises: (i) a fluoride source, (ii) at least one organic amine, (iii) 70% to 98% water, and optionally at least one metal chelating agent and optionally a nitrogen-containing carboxylic acid or an imine.

Such formulations of the invention effectively remove inorganic residues following a plasma ashing and/or CMP step.

Such formulations also effectively remove metal halide and metal oxide residues following plasma ashing, and effectively remove slurry particles of aluminum oxides and other oxides remaining after CMP (chemical mechanical polishing).

The formulations of the present invention provide better stripping performance with less corrosivity than formulations containing either ammonium fluoride or amines. Formulations in accordance with the invention also provide better stripping performance at lower processing temperatures than conventional amine-containing formulations.

The formulations of the invention utilize a chelating agent, which may be a single-component chelating agent or a multicomponent-chelating agent, to prevent metal corrosion and increase stripping effectiveness.

Other features and advantages of the present invention will be from the ensuing disclosure and appended claims.

DETAILED DESCRIPTION OF THE INVENTION AND PREFERRED EMBODIMENTS THEREOF

Figure 1:
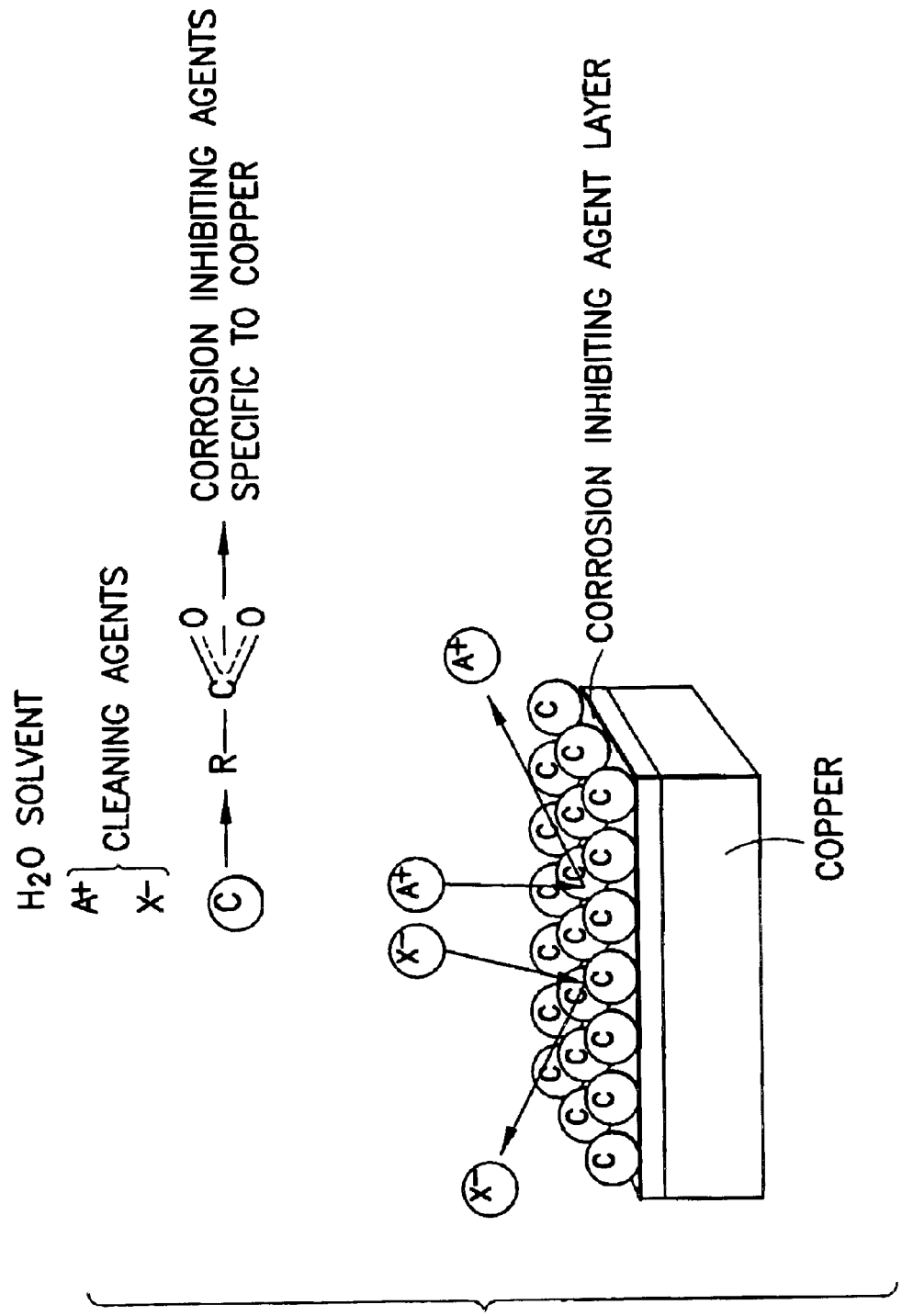
FIG. 1 is a schematic representation of a copper-specific corrosion inhibitor useful in the broad practice of the present invention, which forms a protective layer on the copper metal to prevent corrosion.

The formulations of the present invention are suitable for stripping inorganic wafer residues deriving from high-density plasma etching followed by ashing with oxygen-containing plasmas. Such formulations, in dilute form, are also suitable for removing slurry particles of aluminum oxides and other oxides remaining after CMP (chemical mechanical polishing).

The formulations advantageously contain (i) a fluoride source, such as ammonium fluoride and/or derivative(s) of ammonium fluoride, (ii) an amine or mixture of amines, (iii) a nitrogen-containing carboxylic acid or imine, (iv) water, and, optionally and preferably, (v) one or more metal chelating agents.

As used herein, a fluoride source refers to a compound or a mixture of compounds that in the aqueous cleaning formulation provides fluorine anions.

The preferred formulations for post etch removal include the following components in the percentage by weight (based on the total weight of the formulation) ranges shown:

| | |
|---|---|
| fluoride source | 1–35% |
| organic amine(s) | 20–60% |
| a nitrogenous component selected from nitrogen containing carboxylic acids and imines | 0.1–40% |
| water | 20–50% |
| metal chelating agent(s) | 0–21% |
| TOTAL | 100% |

The preferred formulations for post CMP cleaning include the following components in the percentage by weight (based on the total weight of the formulation) ranges shown:

| | |
|---|---|
| fluoride source | 0.1%–5% |
| organic amine(s) | 1%–15% |
| a nitrogenous component selected from nitrogen containing carboxylic acids and imines | 0–10% |
| water | 70%–98% |
| metal chelating agent(s) | 0–5% |
| TOTAL | 100% |

The components of the formulation as described above can be of any suitable type or species, as will be appreciated by those of ordinary skill in the art. Specific illustrative and preferred formulation components for each of the ingredients of the formulation are described below.

Particularly preferred amines include one or more of the following:

diglycolamine (DGA), methyldiethanolamine (MDEA), pentamethyldiethylenetriamine (PMDETA), triethanolamine (TEA), and triethylenediamine (TEDA).

Other amines that are highly advantageous include:

hexamethylenetetramine, 3,3-iminobis (N,N-dimethylpropylamine), monoethanolamine 2-(methylamino)ethanol, 4-(2-hydroxyethyl)morpholine 4-(3-aminopropyl)morpholine, and N,N-dimethyl-2-(2-aminoethoxy)ethanol.

Fluoride sources useful in the present invention include any combination of ammonia gas or ammonium hydroxide and hydrogen fluoride gas or hydrofluoric acid. Specific preferred fluoride sources include, but are not limited to one or more of the following:

ammonium fluoride, and ammonium bifluoride.

Other fluoride sources that are highly advantageous include:

triethanolammonium fluoride (TEAF);

diglycolammonium fluoride (DGAF);

methyldiethanolammonium fluoride (MDEAF)

tetramethylammonium fluoride (TMAF); and triethylamine tris(hydrogen fluoride) (TREAT-HF).

Specific preferred nitrogen-containing carboxylic acids and amines include one or more of the following:

iminodiacetic acid (IDA);

glycine;

nitrilotriacetic acid (NTA);
1,1,3,3-tetramethylguanidine (TMG); and
hydroxyethyliminodiacetic acid
ethylenediaminetetracetic acid (EDTA).

Other nitrogen-containing carboxylic acids or imines advantageously utilizable in formulations of the invention include:

$CH_3C(=NCH_2CH_2OH)CH_2C(O)N(CH_3)_2$
$CH_3C(=NCH_2CH_2OCH_2CH_2OH)CH_2C(O)N(CH_3)_2$
$CH_3C(=NH)CH_2C(O)CH_3$
$(CH_3CH_2)_2NC(=NH)N(CH_3CH_2)_2$
$HOOCCH_2N(CH_3)_2$
$HOOCCH_2N(CH_3)CH_2COOH$

Specific preferred metal chelating agents include:
acetoacetamide;
ammonium carbamate;
ammonium pyrrolidinedithiocarbamate (APDC);
dimethyl malonate;
methyl acetoacetate;
N-methyl acetoacetamide;
2,4-pentanedione;
tetramethylammonium thiobenzoate;
1,1,1,5,5,5-hexafluoro-2,4-pentanedione H(hfac);
2,2,6,6-tetramethyl-3,5-heptanedione H(thd);
tetramethylammonium trifluoroacetate;
tetramethylthiuram disulfide (TMTDS);
trifluoracetic acid;
lactic acid;
ammonium lactate;
malonic acid
formic acid,
acetic acid,
propionic acid,
gamma-butyrolactone,
methyldiethanolammonium trifluoroacetate, and
trifluoroacetic acid.

The combination of ammonium fluoride or a substituted fluoride source, as described above, with an amine (other than an amine present as a surfactant in an amount of 1% or less) provides better stripping performance with less corrosivity than formulations containing either ammonium fluoride or amines alone. In addition, the resulting alkaline solutions are effective at lower processing temperatures (e.g., 21°–40° C.) than conventional amine-containing formulations.

The presence of nitrogen-containing carboxylic acids and/or imines enables formulations of the invention to be remarkably effective in stripping residues from semiconductor substrate surfaces containing delicate copper structures.

The nitrogen-containing carboxylic acids or imines provide functional groups that are specifically attracted to free copper atoms. As shown schematically in FIG. 1, the copper-specific corrosion inhibiting-agent C, which contacts the copper surface during the residue-removal process, will attach to the copper surface and form a protective layer to prevent the copper surface being corroded by cleaning agents $A^+$ and $X^-$.

Figure 2:
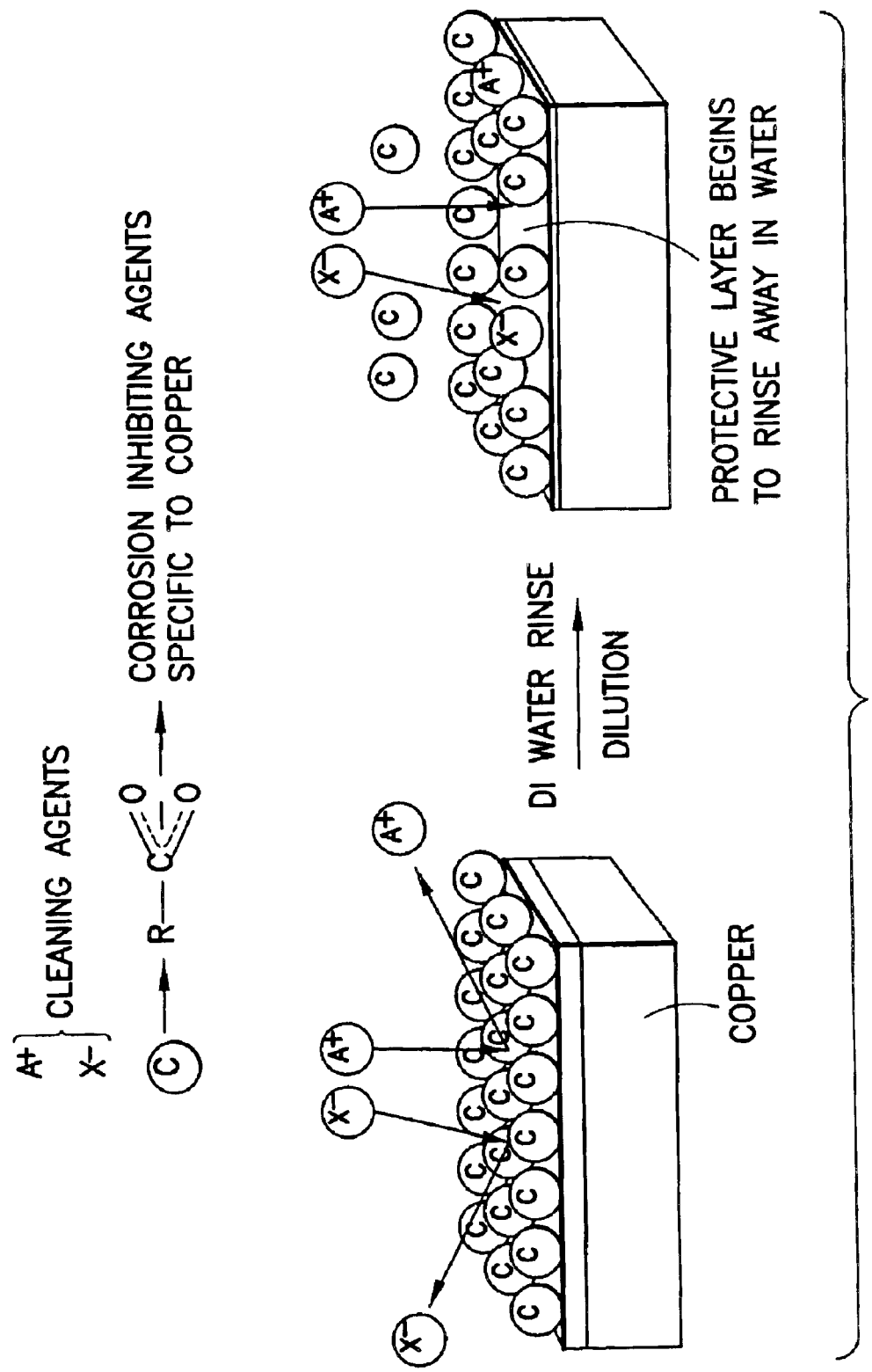
FIG. 2 is a schematic representation of the copper-specific corrosion inhibitor being rinsed away from the copper surface by deionized water.

Moreover, as shown by FIG. 2, such copper-specific corrosion-inhibiting agent C can be easily rinsed off by deionized water or other solutions and therefore leaves very little contamination on the copper surface after the cleaning operation.

The use of 1,3-dicarbonyl compounds as chelating agents and to prevent metal corrosion is a preferred feature of the inventive formulations, to increase their effectiveness.

In various prior art formulations, amines are present in amounts of 1% or less of the formulation as surfactants, or otherwise are not utilized as formulation ingredients at all. Additionally, the prior art formulations are acidic (pH<7) in character. In preferred formulations of the present invention, the amines are present as major components of the formulation, are highly effective in stripping action, and yield formulations of a basic pH character (pH>7).

The formulations of the invention may include a wide variety of organic amines, substituted ammonium fluorides, and nitrogen-containing carboxylic acids, other than those specifically exemplified. Particular substituted ammonium fluorides of suitable character include those of the general formula, $R_1R_2R_3R_4NF$ in which each of the respective R species is independently selected from hydrogen and aliphatic groups. Suitable nitrogen-containing carboxylic acids include those of the general structure COOH—$CH_2$—NRR', wherein R and R' are each independently selected from the group consisting of hydrogen, alkyl, aryl, and carboxylic acid moieties. Suitable metal chelating agents include 1,3-dicarbonyl compounds of the general structure X—CHR—Y. In compounds of such formula, R is either a hydrogen atom or an aliphatic group, e.g., $C_1$–$C_8$ alkyl, aryl, alkenyl, etc. X and Y may be the same as or different from one another, and are functional groups containing multiply-bonded moieties with electron-withdrawing properties, as for example $CONH_2$, CONHR', CN, $NO_2$, SOR', or $SO_2Z$, in which R' represents a $C_1$–$C_8$ alkyl group and Z represents another atom or group, e.g., hydrogen, halo or $C_1$–$C_8$ alkyl.

Other chelating agent species useful in the compositions of the invention include amine trifluoroacetates of the general formula, $R_1R_2R_3R_4N^{+*}O_2CCF_3$ in which each of the R groups is independently selected from hydrogen and aliphatic groups, e.g., $C_1$–$C_8$ alkyl, aryl, alkenyl, etc.

The formulations of the invention optionally may also include such components as surfactants, stabilizers, corrosion inhibitors, buffering agents, and co-solvents, as useful or desired in a given end use application of formulations of the invention.

Formulations in accordance with the present invention are particularly useful on wafers that have been etched with chlorine- or fluorine-containing plasmas, followed by oxygen plasma ashing. The residues generated by this type of processing typically contain metal oxides. Such residues are often difficult to dissolve completely without causing corrosion of metal and titanium nitride features required for effective device performance. Also, metal oxide and silicon oxide slurry particles remaining after CMP will also be effectively removed by formulations in accordance with the present invention.

The features and advantages of the invention are more fully shown by the following non-limiting examples.

EXAMPLE 1

Copper-specific corrosion inhibitors including either hydrogen-containing carboxylic acids or imines were tested in two different types of alkaline cleaning formulations, with the following components and characteristics.

TABLE 1

|  | Components | Temp., (° C.) | pH | Copper Etch Rate (Å/min) |
|---|---|---|---|---|
| Formulation 1 | dimethylacetoacetamide, amine, and water | 70 | 6.2 | 17.4 |
| Formulation 2 | ammonium fluoride, triethanolamine, pentamethdiethylenetriamine, and water | 40 | 8.6 | 7.5 |

The copper etch rate was determined by a standard four-point probe technique. Addition of corrosion inhibitors in accordance with the present invention significantly slowed down the copper etch rate, as shown by the following table, and effectively prevented undesirable corrosion during the cleaning process:

TABLE 2

| Corrosion Inhibitor | Temp. (° C.) | Formulation Used | Concentration (%) | pH of solution | Copper Etch Rate (Å/min) | Reduction of Etch Rate (%) |
|---|---|---|---|---|---|---|
| Iminodiacetic Acid | 40 | 2 | 1.5 | 8.0 | 1–2 | −73.3–86.7 |
| Glycine | 40 | 2 | 1.5 | 9.2 | 3.6 | −52.0 |
| Nitrilotriacetic Acid | 40 | 2 | 1.5 | 8.2 | 3.6 | −52.0 |
| 1,1,3,3-tetramethylguanidine | 40 | 2 | 1.5 | 8.7 | 3.4 | −54.7 |
| $CH_3C(=NCH_2CH_2OH)CH_2C(O)N(CH_3)_2$ | 70 | 1 | 24 | 10.9 | 6.2 | −64.4 |
| $CH_3C(=NCH_2CH_2OCH_2CH_2OH)CH_2C(O)N(CH_3)_2$ | 70 | 1 | 36 | 10.7 | 0.32 | −98.2 |
| $CH_3C(=NH)CH_2C(O)CH_3$ | 40 | 2 | 13.68 | 7.9 | 4.4 | −41.3 |

EXAMPLE 2

A contamination test was carried out on Formulation 2 containing iminodiacetic acid inhibitor. The semiconductor wafer to be cleaned contained copper and silicon films. After the completion of the cleaning operation, the wafer was rinsed by deionized water at 25° C. for about 15 minutes. The Secondary Ion Mass Spectrometry data (SIMS) obtained are as follows:

|  | Cu (atoms/cm$^2$) | F (atoms/cm$^2$) | C (atoms/cm$^2$) | $Cu_xO$ (Å) |
|---|---|---|---|---|
| Uncleaned Wafer | $1.6 \times 10^{10}$ | $3.3 \times 10^{13}$ | $7.5 \times 10^{13}$ | 42 |
| Cleaned Wafer | $8.5 \times 10^9$ | $5.1 \times 10^{13}$ | $1.5 \times 10^{13}$ | 15 |

The foregoing results show that the copper oxide $Cu_xO$ has been effectively removed by the cleaning process, while carbon contamination, which is mainly caused by the organic corrosion inhibitors in the cleaning formulation, has been greatly reduced.

The present invention employs dilute alkaline fluoride in compositions for post CMP cleaning of silicon oxide or aluminum oxide particles from metallic surfaces such as copper or tungsten.

Figure 3:
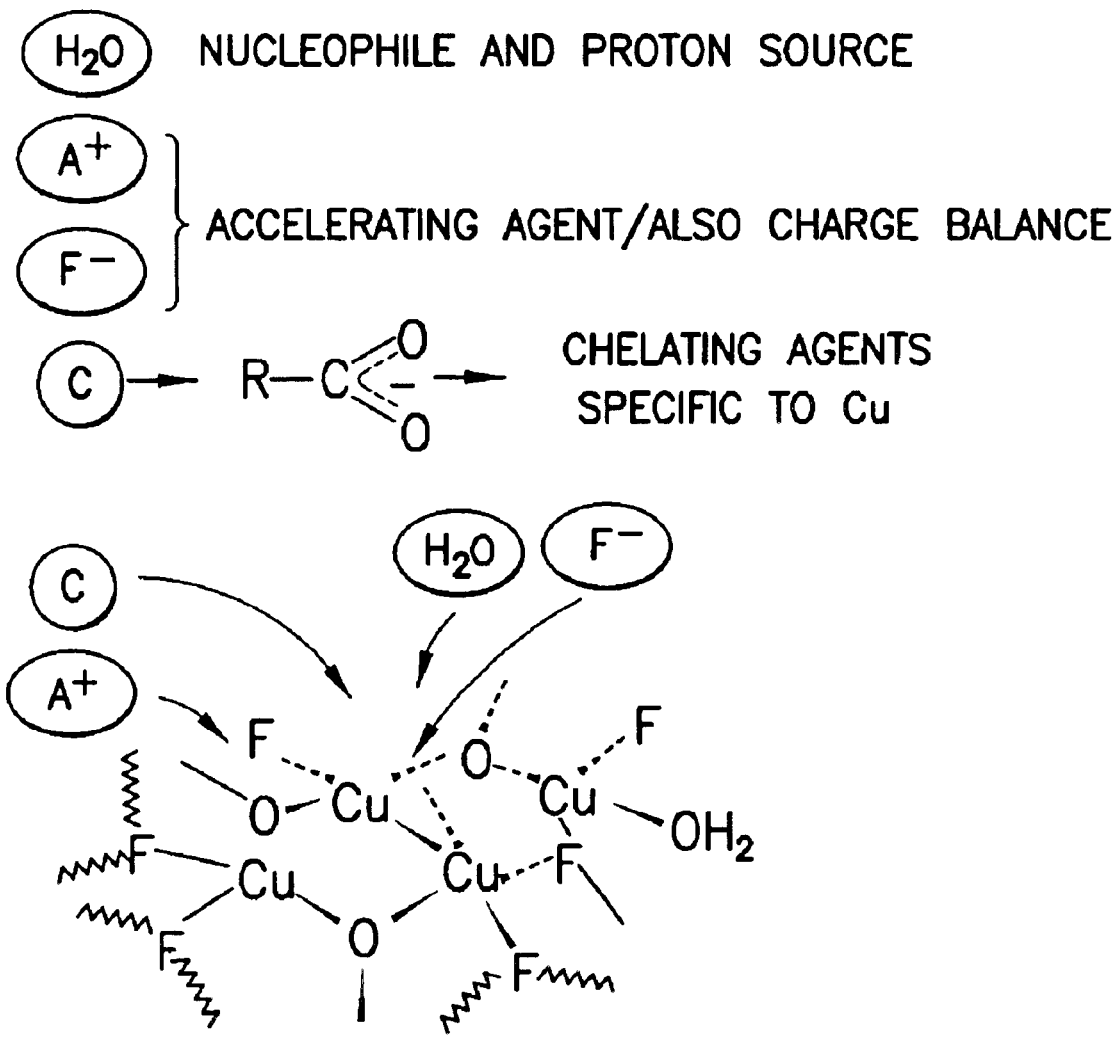
FIG. 3 depicts cleaning components of the present invention interacting with a surface.

FIG. 3 depicts how the cleaning components of the present invention interact with the surface. Specially, FIG. 3 depicts that Alkaline Fluoride 30 and chelating agents 32 dissolving inorganic oxide residues 34 after a CMP process.

Figure 4:
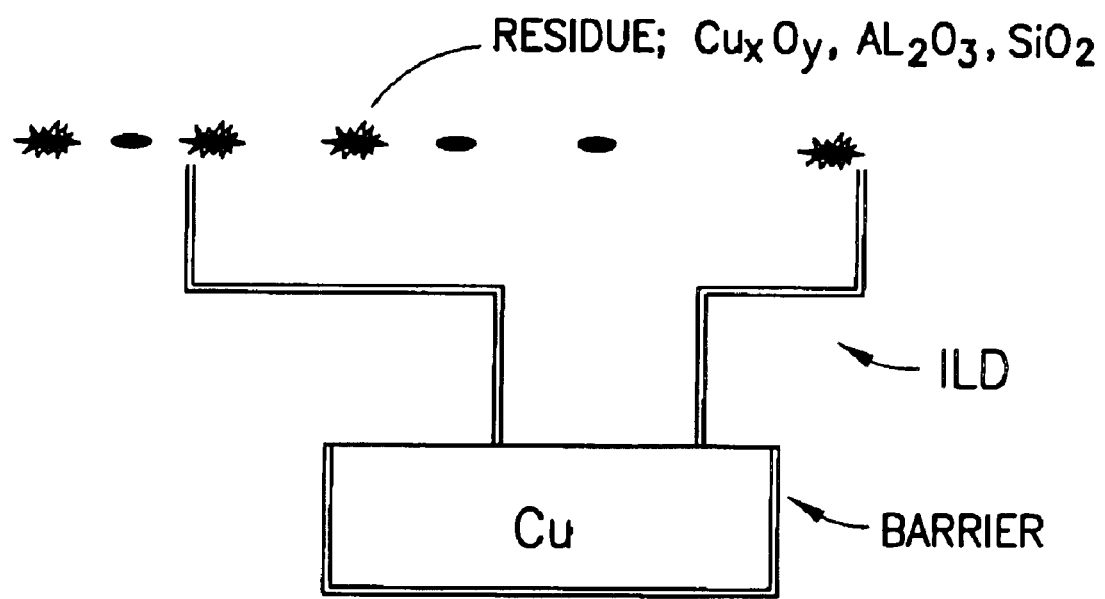
FIG. 4 illustrates that formulations of the present invention maybe used to remove residues and particles.

FIG. 4 illustrates that the formulations taught by the present invention may be used to remove residues 40 and particles 42 for a copper surface 44. In FIG. 4 particles 42 and residues 40 adhere to metal surface 44 as well as dielectric surface 46. Particles 42 and residues 40 may remain following a CMP process. The chemical solutions of the present invention degrade the attractive forces between the residue and the surface as well as dissolve copper and tungsten oxides and oxy-halides.

Formulations that have been found to be effective in cleaning residue and slurry particles from metal surfaces may have a pH value in a range for from about 3 to 11, but typically have pH values between about 7 and about 9. These formulations generally are aqueous solutions that comprise a fluoride source, an organic amine, and metal chelating agent. The individual constituents typically constitute a fluoride source and/or a derivative thereof as about 0.1 to about 5.0% of the formulation, wherein the fluoride may be one of many such fluoride sources known to those skilled in the art including one or more of:

any combination of ammonia gas or ammonium hydroxide and hydrogen fluoride gas or hydrofluoric acid;
ammonium fluoride,
ammonium bifluoride;
triethanolammonium fluoride (TEAF);
diglycolammonium fluoride (DGAF);
methyldiethanolammonium fluoride (MDEAF)
tetramethylammonium fluoride (TMAF);
triethylamine tris(hydrogen fluoride) (TREAT-HF).

The organic amine or mixture of two amines typically comprises between about 1% and about 15% of the formulation of the present invention, wherein the organic amine can be one of many such organic amines known to those skilled in the art including:

diglycolamine (DGA),
methyldiethanolamine (MDEA),
pentamethyldiethylenetriamine (PMDETA),
triethanolamine (TEA), triethylenediamine (TEDA),
hexamethylenetetramine,
3,3-iminobis (N,N-dimethylpropylamine),
monoethanolamine,
2-(methylamino)ethanol,
4-(2-hydroxyethyl)morpholine
4-(3-aminopropyl)morpholine, and
N,N-dimethyl-2-(2-aminoethoxy)ethanol.

The nitrogenous component of the mixture typically comprises 0 to about 10% of the mixture, wherein the nitrogenous component may be one of many such nitrogenous component sources known to those skilled in the art including one or more of:

iminodiacetic acid (IDA),
glycine,
nitrilotriacetic acid (NTA),
hydroxyethyliminodiacetic acid,
1,1,3,-tetramethylguanidine (TMG),
ethylenediaminetetracetic acid (EDTA),
$CH_3C(=NCH_2CH_2OH)CH_2C(O)N(CH_3)_2$,
$CH_3C(=NCH_2CH_2OCH_2CH_2OH)CH_2C(O)N(CH_3)_2$,
$CH_3C(=NH)CH_2C(O)CH_3$,
$(CH_3CH_2)_2NC(=NH)N(CH_3CH_2)_2$,
$HOOCCH_2N(CH_3)_2$, and
$HOOCCH_2N(CH_3)CH_2COOH$.

The metal chelating agent or mixture of chelating agents typically comprises about 0 to about 5.0% of the formulation. Typical metal chelating agent may be one of many such metal chelating agents known to those skilled in the art including:

acetoacetamide;
ammonium carbamate;
ammonium pyrrolidinedithiocarbamate (APDC);
dimethyl malonate;
methyl acetoacetate;
N-methyl acetoacetamide;
2,4-pentanedione;
1,1,1,5,5,5-hexafluoro-2,4-pentanedione H(hfac);
2,2,6,6-tetramethyl-3,5-heptanedione H(thd);
tetramethylammonium thiobenzoate;
tetramethylammonium trifluoroacetate;
tetramethylthiuram disulfide (TMTDS);
trifluoracetic acid;
lactic acid;
ammonium lactate;
malonic acid
formic acid,
acetic acid,
propionic acid,
gamma-butyrolactone,
methyldiethanolammonium trifluoroacetate, and
trifluoroacetic acid.

Several representative examples of formulations are:

| | |
|---|---|
| Triethanolamine | 4.5% |
| Ammonium Fluoride | 0.5% |
| Water | 95% |
| PMDETA | 3.8–4.5% |
| Ammonium Fluoride | 0.5% |

-continued

| | |
|---|---|
| 2,4-Pentanedione | 1% |
| Water | 94–94.7% |
| TEA | 1.7% |
| PMDETA | 1.5% |
| TEAF | 2% |
| Iminodiacetic Acid | 0.4% |
| Ammonium Bifluoride | 0.5% |
| Water | 93.9% |
| TEA | 3.5% |
| PMDETA | 1.5% |
| 2,4-Pentanedione | 1.35% |
| Ammonium Fluoride | 1.2% |
| Water | 92.45% |
| TEA | 7% |
| PMDETA | 3% |
| 2,4-Pentanedione | 2.7% |
| Ammonium Fluoride | 2.4% |
| Water | 84.9% |

Figure 5:
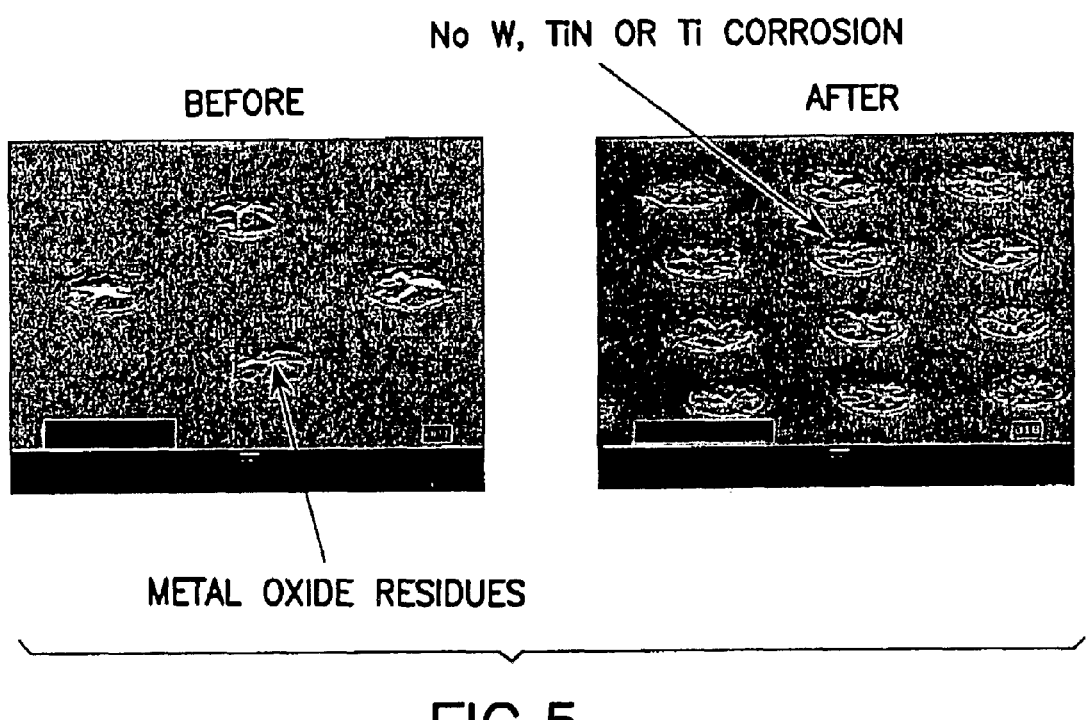
FIG. 5 provides a SEM representing results obtained from an immersion process.

Wafers can be immersed in chemical solutions or chemicals can be applied to the wafer surface by spray or through a brush scrubbing system. FIG. 5 depicts a SEM representing the results obtained with a standard immersion process. Specifically FIG. 5 depicts Tungsten plugs after alumina slurry CMP and immersion in formula c for 10 min at 30° C. Furthermore,

TABLE 3

Figure 6:
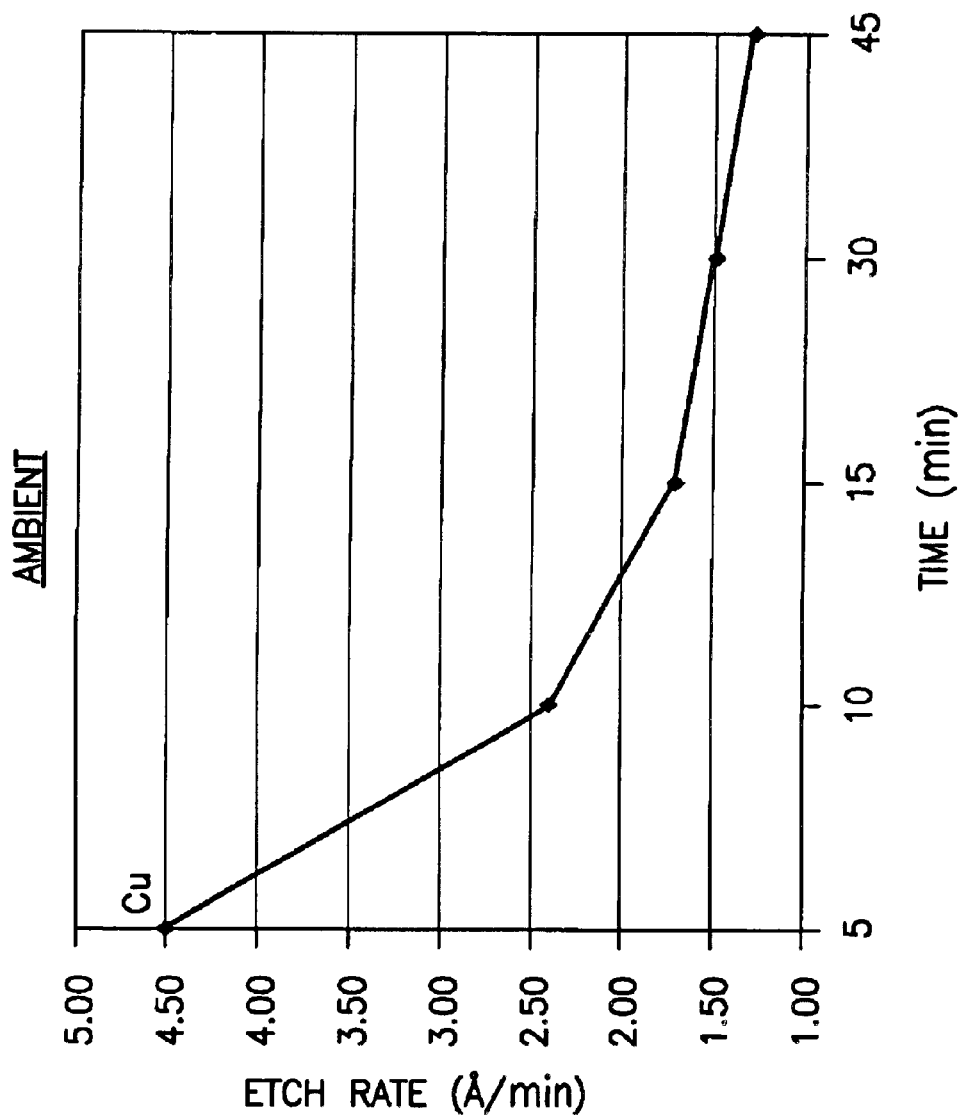
FIG. 6 illustrates the material etch rate on interconnect materials.

| Material | Etch Rate, Å/min for 21° C. @ 30 min |
|---|---|
| Copper | ~1 |
| Tantalum Nitride | <0.1 |
| Titanium | <0.1 |
| Titanium Nitride | 1.0 |
| Tungsten | 0.2 |
| TEOS | 1.5 |
| BPSG | 4.5 | selectivity to exposed materials may be illustrated by etch rate data. FIG. 6 and table 3 illustrate the material etch rate on interconnect materials including an electroplated copper film.

While the invention has been described herein with reference to specific features, aspects, and embodiments, it will be appreciated that the invention is not thus limited. The invention therefore may correspondingly embodied in a wide variety of compositions, with corresponding variations of ingredients, and end-use applications. The invention therefore is to be understood as encompassing all such variations, modifications and alternative embodiments, within the spirit and scope of the invention as hereafter claimed.

What is claimed is:

1. A post CMP cleaning formulation comprising an organic amine, a fluoride source and from 70% to 98% water by weight, based on the total weight of the formulation, wherein the pH of the post CMP cleaning formulation is between about 7 and about 9.

2. The post CMP cleaning formulation according to claim 1, wherein said formulation further comprises a metal chelating agent.

3. The post CMP cleaning formulation according to claim 2, wherein said formulation further comprises a nitrogenous component.

4. The post CMP cleaning formulation according to claim 1, wherein said fluoride source comprises from about 0.1% to about 5.0% fluoride source by weight, based on the total weight of the formulation.

5. The post CMP cleaning formulation according to claim 1, wherein said fluoride is selected from the group consisting of:
  any combination of ammonia gas or ammonium hydroxide and hydrogen fluoride gas or hydrofluoric acid,
  ammonium fluoride,
  ammonium bifluoride,
  triethanolammonium fluoride, (TEAF),
  diglycolammonium fluoride, (DGAF),
  tetramethylammonium fluoride, (TMAF),
  methyldiethanolammonium fluoride, (MDEAF) and
  triethylamine tris(hydrogen fluoride) (TREAT-HF).

6. The post CMP cleaning formulation according to claim 1, wherein said formulation comprises from about 1% to 15% organic amine by weight, based on the total weight of the formulation.

7. The post CMP cleaning formulation according to claim 1, wherein said organic amine is selected from the group consisting of:
  diglycolamine (DGA),
  methyldiethanolamine (MDEA),
  pentamethyldiethylenetriamine (PMDETA),
  triethanolamine (TEA),
  triethylenediamine (TEDA),
  hexamethylenetetramine,
  3,3-iminobis (N,N-dimethylpropylamine),
  monoethanolamine,
  2-(methylamino)ethanol,
  4-(2-hydroxyethyl)morpholine,
  4-(3-aminopropyl)morpholine, and
  N,N-dimethyl-2-(2-aminoethoxy)ethanol.

8. The post CMP cleaning formulation according to claim 2, wherein said formulation comprises from about 0 to about 5.0% metal chelating agent by weight, based on the total weight of the formulation.

9. The post CMP cleaning formulation according to claim 2, wherein said metal chelating agent is selected from the group consisting of:
  acetoacetamide,
  ammonium carbamate,
  ammonium pyrrolidinedithiocarbamate (APDC),
  dimethyl malonate,
  methyl acetoacetate,
  N-methyl acetoacetamide,
  2,4-pentanedione,
  1,1,1,5,5,5-hexafluoro-2,4-pentanedione H(hfac),
  2,2,6,6-tetramethyl-3,5-heptanedione H(thd),
  tetramethylammonium thiobenzoate,
  tetramethylammonium trifluoroacetate,
  tetramethylthiuram disulfide (TMTDS),
  trifluoracetic acid,
  lactic acid,
  ammonium lactate,
  malonic acid,
  formic acid,
  acetic acid,
  propionic acid,
  gama-butyrolactone,
  methyldiethanolammonium trifluoroacetate, and
  trifluoroacetic acid.

10. The post CMP cleaning formulation according to claim 3, wherein said formulation comprises from about 0 to about 10% nitrogenous component by weight, based on the total weight of the formulation.

11. The post CMP cleaning formulation according to claim 3, wherein said nitrogenous component is selected from the group consisting of:
  iminodiacetic acid (IDA),
  glycine,
  nitrilotriacetic acid (NTA),
  hydroxyethyliminodiacetic acid,
  1,1,3,-tetramethylguanidine (TMG),
  ethylenediaminetetracetic acid (EDTA),
  $CH_3C(=NCH_2CH_2OH)CH_2C(O)N(CH_3)_2$,
  $CH_3C(=NCH_2CH_2OCH_2CH_2OH)CH_2C(O)N(CH_3)_2$,
  $CH_3C(=NH)CH_2C(O)CH_3$,
  $(CH_3CH_2)_2NC(=NH)N(CH_3CH_2)_2$,
  $HOOCCH_2N(CH_3)_2$, and
  $HOOCCH_2N(CH_3)CH_2COOH$.

12. The post CMP cleaning formulation according to claim 1, wherein said formulation comprises the following components in the percentage by weight shown, based on the total weight of such formulation:

| | |
|---|---|
| triethanolamine | 4.5%, |
| ammonium Fluoride | 0.5%, and |
| water | 95%. |

13. The post CMP cleaning formulation according to claim 1, wherein said formulation comprises the following components in the percentage by weight ranges shown, based on the total weight of such formulation:

| | |
|---|---|
| PMDETA | 3.8–4.5%, |
| ammonium fluoride | 0.5%, |
| 2,4-Pentanedione | 1%, and |
| water | 94–94.7%. |

14. The post CMP cleaning formulation according to claim 1, wherein said formulation comprises the following components in the percentage by weight shown, based on the total weight of such formulation:

| | |
|---|---|
| TEA | 1.7% |
| PMDETA | 1.5% |
| TEAF | 2%, |
| iminodiacetic Acid | 0.4%, |
| ammonium bifluoride | 0.5%, and |
| water | 93.9%. |

15. The post CMP cleaning formulation according to claim 1, wherein said formulation comprises the following components in the percentage by weight shown, based on the total weight of such formulation:

| | |
|---|---|
| TEA | 3.5%, |
| PMDETA | 1.5%, |
| 2,4-Pentanedione | 1.35%, |
| ammonium fluoride | 1.2%, and |
| water | 92.45%. |

16. The post CMP cleaning formulation according to claim 1, wherein said formulation comprises the following components in the percentage by weight shown, based on the total weight of such formulation:

| | |
|---|---|
| TEA | 7%, |
| PMDETA | 3%, |
| 2,4-Pentanedione | 2.7%, |
| ammonium fluoride | 2.4%, and |
| water | 84.9%. |

17. A semiconductor wafer cleaning formulation comprising the following components in the percentage by weight ranges shown, based on the total weight of such components:

| | |
|---|---|
| fluoride source | 1–35% |
| organic amine(s) | 20–60% |
| a nitrogenous component, selected from the group consisting of nitrogen-containing carboxylic acids and imines | 0.1–40% |
| water | 20–50% and |
| metal chelating agent(s) | 0–21% |
| TOTAL | 100%. |

18. The cleaning formulation of claim 17, wherein said fluoride source comprises a fluoride species selected from the group consisting of:
  any combination of ammonia gas or ammonium hydroxide and hydrogen fluoride gas or hydrofluoric acid,
  ammonium bifluoride,
  ammonium fluoride,
  triethanolammonium fluoride (TEAF),
  diglycolammonium fluoride (DGAF),
  tetramethylammonium fluoride (TMAF),
  methyldiethanolammonium fluoride (MDEAF), and
  triethylamine tris(hydrogen fluoride) (TREAT-HF).

19. The cleaning formulation of claim 17, wherein said organic amine(s) comprise an amine(s) selected from the group consisting of:
  diglycolamine (DGA),
  methyldiethanolamine (MDEA),
  pentamethyldiethylenetriamine (PMDETA),
  triethanolamine (TEA),
  triethylenediamine (TEDA),
  hexamethylenetetramine,
  3,3-iminobis (N,N-dimethylpropylamine),
  monoethanolamine,
  2-(methylamino)ethanol,
  4-(2-hydroxyethyl)morpholine,
  4-(3-aminopropyl)morpholine, and
  N,N-dimethyl-2-(2-aminoethoxy)ethanol.

20. The cleaning formulation of claim 17, wherein said nitrogenous component comprises a species selected from the group consisting of:
  iminodiacetic acid (IDA),
  glycine,
  nitrilotriacetic acid (NTA),
  hydroxyethyliminodiacetic acid,
  1,1,3,-tetramethylguanidine (TMG),
  ethylenediaminetetracetic acid (EDTA),
  $CH_3C(=NCH_2CH_2OH)CH_2C(O)N(CH_3)_2$,
  $CH_3C(=NCH_2CH_2OCH_2CH_2OH)CH_2C(O)N(CH_3)_2$,
  $CH_3C(=NH)CH_2C(O)CH_3$,
  $(CH_3CH_2)_2NC(=NH)N(CH_3CH_2)_2$,
  $HOOCCH_2N(CH_3)_2$, and
  $HOOCCH_2N(CH_3)CH_2COOH$.

21. The cleaning formulation of claim 17, including at least one metal chelating agent selected from the group consisting of:
  acetoacetamide,
  ammonium carbamate,
  ammonium pyrrolidinedithiocarbamate (APDC),
  dimethyl malonate,
  methyl acetoacetate,
  N-methyl acetoacetamide,
  2,4-pentanedione,
  1,1,1,5,5,5-hexafluoro-2,4-pentanedione H(hfac),
  2,2,6,6-tetrammethyl-3,5-heptanedione H(thd),
  tetramethylammonium thiobenzoate,
  tetramethylammonium trifluoroacetate,
  tetramethylthiuram disulfide (TMTDS),
  trifluoracetic acid,
  lactic acid,
  ammonium lactate,
  malonic acid,
  formic acid,
  acetic acid,
  propionic acid,
  gamma-butyrolactone,
  iminodiacetic acid,
  methyldiethanolammonium trifluoroacetate, and
  trifluoroacetic acid.

22. The cleaning formulation of claim 17, wherein said fluoride source comprises a species selected from the group consisting of:
  any combination of ammonia gas or ammonium hydroxide and hydrogen fluoride gas or hydrofluoric acid,
  ammonium fluoride,
  ammonium bifluoride,
  triethanolammonium fluoride (TEAF),
  diglycolammonium fluoride (DGAF),
  methyldiethanolammonium fluoride (MDEAF),
  tetramethylammonium fluoride (TMAF), and
  triethylamine tris(hydrogen fluoride) (TREAT-HF);
said organic amine(s) comprise a species selected from the group consisting of:
  diglycolamine (DGA),
  methyldiethanolamine (MDEA),
  pentamethyldiethylenetriamine (PMDETA),
  triethanolamine (TEA),
  triethylenediamine (TEDA),
  hexamethylenetetramine,
  3,3-iminobis (N,N-dimethylpropylamine),
  monoethanolamine,
  2-(methylamino)ethanol,
  4-(2-hydroxyethyl)morpholine, 4-(3-aminopropyl)morpholine, and
N,N-dimethyl-2-(2-aminoethoxy)ethanol;
said nitrogenous component comprises a species selected from the group consisting of:
   iminodiacetic acid (IDA),
   glycine,
   nitrilotriacetic acid (NTA),
   hydroxyethyliminodiacetic acid,
   1,1,3,-tetramethylguanidine (TMG),
   ethylenediaminetetracetic acid (EDTA),
   $CH_3C(=NCH_2CH_2OH)CH_2C(O)N(CH_3)_2$,
   $CH_3C(=NCH_2CH_2OCH_2CH_2OH)CH_2C(O)N(CH_3)_2$,
   $CH_3C(=NH)CH_2C(O)CH_3$,
   $(CH_3CH_2)_2NC(=NH)N(CH_3CH_2)_2$,
   $HOOCCH_2N(CH_3)_2$, and
   $HOOCCH_2N(CH_3)CH_2COOH$; and
said formulation includes a metal chelating agent comprising a species selected from the group consisting of:
   acetoacetamide,
   ammonium carbamate,
   ammonium pyrrolidinedithiocarbamate (APDC),
   dimethyl malonate,
   methyl acetoacetate,
   N-methyl acetoacetamide,
   2,4-pentanedione,
   1,1,1,5,5,5-hexafluoro-2,4-pentanedione H(hfac),
   2,2,6,6-tetrammethyl-3,5-heptanedione H(thd),
   tetramethylammonium thiobenzoate,
   tetramethylammonium trifluoroacetate,
   tetramethylthiuram disulfide (TMTDS),
   trifluoracetic acid,
   lactic acid,
   ammonium lactate,
   malonic acid,
   formic acid,
   acetic acid,
   propionic acid,
   gamma-butyrolactone,
   iminodiacetic acid,
   methyldiethanolammonium trifluoroacetate, and
   trifluoroacetic acid.

23. The cleaning formulation of claim 17, wherein said fluoride source comprises a compound having the general formula $R_1R_2R_3R_4NF$ in which each of the R groups is independently selected from hydrogen atoms and aliphatic groups, and wherein said formulation includes a metal chelating agent of the formula:

$$X\text{—}CHR\text{—}Y,$$

in which R is either hydrogen or an aliphatic group and X and Y are functional groups containing multiply bonded moieties having electron-withdrawing properties.

24. The cleaning formulation of claim 23, wherein each of X and Y is independently selected from $CONH_2$, $CONHR'$, $CN$, $NO_2$, $SOR'$, and $SO_2Z$ in which R' is alkyl and Z is hydrogen, halo, or alkyl.

25. The cleaning formulation of claim 17, wherein said fluoride source comprises a compound having the formula $R_1R_2R_3R_4NF$ in which each of the R groups is hydrogen or aliphatic, and wherein said formulation includes a metal chelating agent of the formula, $R_1R_2R_3R_4N^{+-O}{}_2CCF_3$ in which each of the R groups is independently hydrogen or aliphatic.

26. The cleaning formulation of claim 17, wherein said nitrogenous component includes a compound having the formula:

$$COOH\text{—}CH_2\text{—}NRR'$$

wherein each of R and R' is independently selected from the group consisting of hydrogen, alkyl, aryl, and carboxylic acids.

27. A method for fabricating a semiconductor wafer, comprising:
   plasma etching a metallized layer from a surface of the wafer;
   plasma ashing a resist from the surface of the wafer; and
   cleaning the wafer by contacting same with a cleaning formulation, comprising the following components in the percentage by weight ranges shown, based on the total weight of such components:

| | |
|---|---|
| fluoride source | 1–35% |
| organic amine(s) | 20–60% |
| a nitrogenous component, selected from the group consisting of nitrogen-containing carboxylic acids and imines | 0.1–40% |
| water | 20–50% |
| metal chelating agent(s) | 0–21% |
| TOTAL | 100%. |

28. The method of claim 27, wherein said fluoride source comprises a fluoride species selected from the group consisting of:
   any combination of ammonia gas or ammonium hydroxide and hydrogen fluoride gas or hydrofluoric acid,
   ammonium fluoride,
   ammonium bifluoride,
   triethanolammonium fluoride (TEAF),
   diglycolammonium fluoride (DGAF),
   methyldiethanolammonium fluoride (MDEAF),
   tetramethylammonium fluoride (TMAF), and
   triethylamine tris(hydrogen fluoride) (TREAT-HF).

29. The method of claim 27, wherein said organic amine(s) comprise an amine(s) selected from the group consisting of:
   diglycolamine (DGA),
   methyldiethanolamine (MDEA),
   pentamethyldiethylenetriamine (PMDETA),
   triethanolamine (TEA),
   triethylenediamine (TEDA),
   hexamethylenetetramine,
   3,3-iminobis (N,N-dimethylpropylamine),
   monoethanolamine,
   2-(methylamino)ethanol,
   4-(2-hydroxyethyl)morpholine,
   4-(3-aminopropyl)morpholine, and
   N,N-dimethyl-2-(2-aminoethoxy)ethanol.

30. The method of claim 27, wherein said nitrogenous component comprises a species selected from the group consisting of:
   iminodiacetic acid (IDA), glycine,
nitrilotriacetic acid (NTA),
hydroxyethyliminodiacetic acid,
1,1,3,-tetramethylguanidine (TMG),
ethylenediaminetetracetic acid (EDTA),
$CH_3C(=NCH_2CH_2OH)CH_2C(O)N(CH_3)_2$,
$CH_3C(=NCH_2CH_2OCH_2CH_2OH)CH_2C(O)N(CH_3)_2$,
$CH_3C(=NH)CH_2C(O)CH_3$,
$(CH_3CH_2)_2NC(=NH)N(CH_3CH_2)_2$,
$HOOCCH_2N(CH_3)_2$,
$HOOCCH_2N(CH_3)CH_2COOH$.

31. The method of claim 27, including at least one metal chelating agent selected from the group consisting of:
acetoacetamide,
ammonium carbamate,
ammonium pyrrolidinedithiocarbamate (APDC),
dimethyl malonate,
methyl acetoacetate,
N-methyl acetoacetamide,
2,4-pentanedione,
1,1,1,5,5,5-hexafluro0-2,4-pentanedione H(hfac),
2,2,6,6-tetrammethyl-3,5-heptanedione H(thd),
tetramethylammonium thiobenzoate,
tetramethylammonium trifluoroacetate,
tetramethylthiuram disulfide (TMTDS),
trifluoracetic acid,
lactic acid,
ammonium lactate,
malonic acid,
formic acid,
acetic acid,
propionic acid,
gamma-butyrolactone,
iminodiacetic acid,
methyldiethanolammonium trifluoroacetate, and
trifluoroacetic acid.

32. The method of claim 27, wherein said fluoride source comprises a species selected from the group consisting of:
any combination of ammonia gas or ammonium hydroxide and hydrogen fluoride gas or hydrofluoric acid,
ammonium fluoride,
ammonium bifluoride,
triethanolammonium fluoride (TEAF),
diglycolammonium fluoride (DGAF),
methyldiethanolammonium fluoride (MDEAF),
tetramethylammonium fluoride (TMAF), and
triethylamine tris(hydrogen fluoride) (TREAT-HF);
said organic amine(s) comprise a species selected from the group consisting of:
diglycolamine (DGA),
methyldiethanolamine (MDEA),
pentamethyldiethylenetriamine (PMDETA),
triethanolamine (TEA),
triethylenediamine (TEDA),
hexamethylenetetramine,
3,3-iminobis (N,N-dimethylpropylamine),
monoethanolamine,
2-(methylamino)ethanol,
4-(2-hydroxyethyl)morpholine
4-(3-aminopropyl)morpholine, and
N,N-dimethyl-2-(2-aminoethoxy)ethanol;
said nitrogenous component comprises a species selected from the group consisting of:
iminodiacetic acid (IDA),
glycine,
nitrilotriacetic acid (NTA),
hydroxyethyliminodiacetic acid,
1,1,3,-tetramethylguanidine (TMG),
ethylenediaminetetracetic acid (EDTA),
$CH_3C(=NCH_2CH_2OH)CH_2C(O)N(CH_3)_2$,
$CH_3C(=NCH_2CH_2OCH_2CH_2OH)CH_2C(O)N(CH_3)_2$,
$CH_3C(=NH)CH_2C(O)CH_3$,
$(CH_3CH_2)_2NC(=NH)N(CH_3CH_2)_2$,
$HOOCCH_2N(CH_3)_2$, and
$HOOCCH_2N(CH_3)CH_2COOH$; and
said formulation includes a metal chelating agent comprising a species selected from the group consisting of:
acetoacetamide,
ammonium carbamate,
ammonium pyrrolidinedithiocarbamate (APDC),
dimethyl malonate,
methyl acetoacetate,
N-methyl acetoacetamide,
2,4-pentanedione,
1,1,1,5,5,5-hexafluro-2,4-pentanedione H(hfac),
2,2,6,6-tetramethyl-3,5-heptanedione H(thd),
tetramethylammonium thiobenzoate,
tetramethylammonium trifluoroacetate,
tetramethylthiuram disulfide (TMTDS),
lactic acid,
ammonium lactate,
malonic acid,
formic acid,
acetic acid,
propionic acid,
gamma-butyrolactone,
methyldiethanolammonium trifluoroacetate, and
trifluoroacetic acid.

33. The method of claim 27, wherein said fluoride source comprises a compound having the general formula $R_1R_2R_3R_4NF$ in which each of the R groups is independently selected from hydrogen atoms and aliphatic groups, and wherein said formulation includes a metal chelating agent of the formula:

$$X-CHR-Y,$$

in which R is either hydrogen or an aliphatic group and X and Y are functional groups containing multiply bonded moieties having electron-withdrawing properties.

34. The method of claim 33, wherein each of X and Y is independently selected from $CONH_2$, $CONHR'$, $CN$, $NO_2$, $SOR'$, and $SO_2Z$ in which R' is alkyl and Z is hydrogen, halo, or alkyl.

35. The method of claim 27, wherein said fluoride source comprises a compound having the formula $R_1R_2R_3R_4NF$ in which each of the R groups is hydrogen or aliphatic, and wherein said formulation includes a metal chelating agent of the formula, $R_1R_2R_3R_4N^{+-O}{}_2CCF_3$ in which each of the R groups is independently hydrogen or aliphatic.

36. The method of claim 27, wherein said nitrogenous component includes a compound having the formula:

COOH—CH$_2$—NRR' wherein each of R and R' is independently selected from the group consisting of hydrogen, alkyl, aryl, and carboxylic acids.

37. A method for fabricating a semiconductor wafer including the steps comprising:
plasma etching a metallized layer from a surface of the wafer;
plasma ashing a resist from the surface of the wafer;
cleaning the wafer by contacting same with a cleaning formulation, comprising the following components in the percentage by weight ranges shown, based on the total weight of such components:

| | |
|---|---|
| a fluoride source; | 1–35% |
| at least one organic amine; | 20–60% |
| a nitrogen-containing carboxylic acid or imine | 0.1–40% |
| water; | 20–50% |
| at least one metal chelating agent | 0–21% |
| TOTAL | 100%. |

38. The method of claim 37, wherein said fluoride source is selected from the group consisting of:
any combination of ammonia gas or ammonium hydroxide and hydrogen fluoride gas or hydrofluoric acid,
ammonium fluoride,
ammonium bifluoride,
triethanolammonium fluoride (TEAF),
diglycolammonium fluoride (DGAF),
methyldiethanolammonium fluoride (MDEAF),
tetramethylammonium fluoride (TMAF), and
triethylamine tris(hydrogen fluoride) (TREAT-HF).

39. The method of claim 37, wherein said organic amine is selected from the group consisting of:
diglycolamine (DGA),
methyldiethanolamine (MDEA),
pentamethyldiethylenetriamine (PMDETA),
triethanolamine (TEA),
triethylenediamine (TEDA),
hexamethylenetetramine,
3,3-iminobis (N,N-dimethylpropylamine),
monoethanolamine,
2-(methylamino)ethanol,
4-(2-hydroxyethyl)morpholine,
4-(3-aminopropyl)morpholine, and
N,N-dimethyl-2-(2-aminoethoxy)ethanol.

40. The method of claim 37, wherein said nitrogen-containing carboxylic acid or imine is selected from the group consisting of:
iminodiacetic acid (IDA),
glycine,
nitrilotriacetic acid (NTA),
hydroxyethyliminodiacetic acid,
1,1,3,-tetramethylguanidine (TMG),
ethylenediaminetetracetic acid (EDTA),
CH$_3$C(=NCH$_2$CH$_2$OH)CH$_2$C(O)N(CH$_3$)$_2$,
CH$_3$C(=NCH$_2$CH$_2$OCH$_2$CH$_2$OH)CH$_2$C(O)N(CH$_3$)$_2$,
CH$_3$C(=NH)CH$_2$C(O)CH$_3$,
(CH$_3$CH$_2$)$_2$NC(=NH)N(CH$_3$CH$_2$)$_2$,
HOOCCH$_2$N(CH$_3$)$_2$, and
HOOCCH$_2$N(CH$_3$)CH$_2$COOH.

41. The method of claim 37, wherein said metal chelating agent is selected from the group consisting of:
acetoacetamide,
ammonium carbamate,
ammonium pyrrolidinedithiocarbamate (APDC),
dimethyl malonate,
methyl acetoacetate,
N-methyl acetoacetamide,
2,4-pentanedione,
1,1,1,5,5,5-hexafluro0-2,4-pentanedione H(hfac),
2,2,6,6-tetramethyl-3,5-heptanedione H(thd),
tetramethylammonium thiobenzoate,
tetramethylammonium trifluoroacetate,
tetramethylthiuram disulfide (TMTDS),
lactic acid,
ammonium lactate,
malonic acid,
formic acid,
acetic acid,
propionic acid,
gamma-butyrolactone,
methyldiethanolammonium trifluoroacetate, and
trifluoroacetic acid.

42. The method of claim 37, wherein said fluoride source is selected from the group consisting of:
any combination of ammonia gas or ammonium hydroxide and hydrogen fluoride gas or hydrofluoric acid,
ammonium fluoride,
ammonium bifluoride,
triethanolammonium fluoride (TEAF),
diglycolammonium fluoride (DGAF),
methyldiethanolammonium fluoride (MDEAF),
tetramethylammonium fluoride (TMAF), and
triethylamine tris(hydrogen fluoride) (TREAT-HF);
said organic amine(s) is selected from the group consisting of:
diglycolamine (DGA),
methyldiethanolamine (MDEA),
pentamethyldiethylenetriamine (PMDETA),
triethanolamine (TEA),
triethylenediamine (TEDA),
hexamethylenetetramine,
3,3-iminobis (N,N-dimethylpropylamine),
monoethanolamine,
2-(methylamino)ethanol,
4-(2-hydroxyethyl)morpholine,
4-(3-aminopropyl)morpholine, and
N,N-dimethyl-2-(2-aminoethoxy)ethanol;
said nitrogen-containing carboxyl acid or imine is selected from the group consisting of:
iminodiacetic acid (IDA),
glycine,
nitrilotriacetic acid (NTA), hydroxyethyliminodiacetic acid,
1,1,3,-tetramethylguanidine (TMG),
ethylenediaminetetracetic acid (EDTA),
$CH_3C(=NCH_2CH_2OH)CH_2C(O)N(CH_3)_2$,
$CH_3C(=NCH_2CH_2OCH_2CH_2OH)CH_2C(O)N(CH_3)_2$,
$CH_3C(=NH)CH_2C(O)CH_3$,
$(CH_3CH_2)_2NC(=NH)N(CH_3CH_2)_2$,
$HOOCCH_2N(CH_3)_2$, and
$HOOCCH_2N(CH_3)CH_2COOH$; and
said formualation includes a metal chelating agent comprising a species selected from the group consisting of:
acetoacetamide,
ammonium carbamate,
ammonium pyrrolidinedithiocarbamate (APDC),
dimethyl malonate,
methyl acetoacetate,
N-methyl acetoacetamide,
2,4-pentanedione,
1,1,1,5,5,5-hexafluro-2,4-pentanedione H(hfac),
2,2,6,6-tetrammethyl-3,5-heptanedione H(thd),
tetramethylammonium thiobenzoate,
tetramethylammonium trifluoroacetate,
tetramethylthiuram disulfide (TMTDS),
trifluoracetic acid,
ammonium lactate,
malonic acid,
formic acid,
acetic acid,
propionic acid,
gamma-butyrolactone,
methyldiethanolammonium trifluoroacetate, and
trifluoroacetic acid.

43. The method of claim 37, wherein said fluoride source comprises a compound having the formula $R_1R_2R_3R_4NF$ in which each of the R groups is hydrogen atoms or aliphatic, and wherein said metal chelating agent has the formula:

X—CHR—Y, in which R is either hydrogen or an aliphatic group, and X and Y are functional groups containing multiply-bonded moieties having electron-withdrawing properties.

44. The method of claim 37, wherein said fluoride source comprises a compound having the formula $R_1R_2R_3R_4NF$ in which each of the R groups is hydrogen or aliphatic, and wherein said metal chelating agent has the formula, $R_1R_2R_3R_4N^{+*}O_2CCF_3$ in which each of the R groups is hydrogen or aliphatic.

45. The method of claim 37, wherein said nitrogen-containing carboxylic acid has the formula:

COOH—CH$_2$—NRR'

Wherein each of R and R' is independently selected from the group consisting of hydrogen, alkyl, aryl, and carboxylic acid.

46. A method of removing residue from a wafer following a resist plasma ashing step on said wafer, comprising contacting the wafer with a cleaning formulation, including (i) a fluoride source, (ii) at least one organic amine, (iii) a nitrogen-containing carboxylic acid or an imine, (iv) water, and optionally at least one metal chelating agent.

47. A wafer cleaning formulation, including (i) a fluoride source, (ii) at least one organic amine, (iii) a nitrogen-containing carboxylic acid or an imine, (iv) water, and optionally at least one metal chelating agent, wherein the pH of the wafer cleaning formulation is between 7 and about 9.

48. A semiconductor wafer cleaning formulation comprising the following components in the percentage by weight ranges shown, based on the total weight of such components:

| | |
|---|---|
| fluoride source | 1–35% |
| organic amine(s) | 20–60% |
| a nitrogenous component, selected from the group consisting of nitrogen-containing carboxylic acids and imines | 0.1–40% |
| water | 20–50% and |
| metal chelating agent(s) | 0–21% |
| TOTAL | 100%, | wherein said fluoride source comprises a compound having the formula $R_1R_2R_3R_4NF$ in which each of the R groups is hydrogen or aliphatic, and wherein said formulation includes a metal chelating agent of the formula, $R_1R_2R_3R_4{}^{+-}O_2CCF_3$ in which each of the R groups is independently hydrogen or aliphatic.

49. A semiconductor wafer cleaning formulation comprising the following components in the percentage by weight ranges shown, based on the total weight of such components:

| | |
|---|---|
| fluoride source | 1–35% |
| organic amine(s) | 20–60% |
| a nitrogenous component, selected from nitrogen-containing carboxylic acids and imines | 0.1–40% |
| water | 20–50% and |
| metal chelating agent(s) | 0–21% |
| TOTAL | 100%, | wherein said nitrogenous component includes a compound having the formula:

COOH—CH$_2$—NRR' wherein each of R and R' is independently selected from the group consisting of hydrogen, alkyl, aryl, and carboxylic acids.

* * * * *

UNITED STATES PATENT AND TRADEMARK OFFICE
CERTIFICATE OF CORRECTION

PATENT NO. : 6,896,826 B2
APPLICATION NO. : 10/047554
DATED : May 24, 2005
INVENTOR(S) : William A. Wojtczak et al.

It is certified that error appears in the above-identified patent and that said Letters Patent is hereby corrected as shown below:

Column 6, line 39, please delete "$R_1R_2R_3R_4N^{+\,*}O_2CCF_3$", and insert in place thereof -- $R_1R_2R_3R_4N^{+\,-}O_2CCF_3$ --
Column 14, line 59, please delete "pentamethyidiethylenetriamine" and insert in place thereof -- pentamethyldiethylene triamine --
Column 16, line 1, please delete "$R_1R_2R_3R_4N^{+-O}{}_2CCF_3$" and insert in place thereof -- $R_1R_2R_3R_4N^{+\,-}O_2CCF_3$ --
Column 18, line 66, please delete "$R_1R_2R_3R_4N^{+-O}{}_2CCF_3$" and insert in place thereof -- $R_1R_2R_3R_4N^{+\,-}O_2CCF_3$ --
Column 21, line 12, please delete "formualation", and insert in place thereof -- formulation --
Column 21, line 52, please delete "$R_1R_2R_3R_4N^{+\,*}O_2CCF_3$" and insert in place thereof -- $R_1R_2R_3R_4N^{+\,-}O_2CCF_3$ --
Column 22, lines 33 and 34, please delete "$R_1R_2R_3R_4{}^{+\,-}{}_{O2}CCF_3$" and insert in place thereof -- $R_1R_2R_3R_4N^{+\,-}O_2CCF_3$ --

Signed and Sealed this

Nineteenth Day of August, 2008

JON W. DUDAS
*Director of the United States Patent and Trademark Office*